(12) United States Patent
Schumacher et al.

(10) Patent No.: US 11,708,038 B2
(45) Date of Patent: *Jul. 25, 2023

(54) OPERATION OF VEHICLE ACCESSORIES BASED ON PREDICTED RUNTIME OF A PRIMARY SYSTEM

(71) Applicant: THERMO KING LLC, Minneapolis, MN (US)

(72) Inventors: Ryan Wayne Schumacher, Bloomington, MN (US); Russell L. Sanders, Minnetonka, MN (US); Mark D. Leasure, Eagan, MN (US); Srinivasa Rao Koppineedi, Karnataka (IN); Michael James Vanous, Minneapolis, MN (US)

(73) Assignee: THERMO KING LLC, Minneapolis, MN (US)

( * ) Notice: Subject to any disclaimer, the term of this patent is extended or adjusted under 35 U.S.C. 154(b) by 155 days.

This patent is subject to a terminal disclaimer.

(21) Appl. No.: 17/184,973

(22) Filed: Feb. 25, 2021

(65) Prior Publication Data
US 2021/0178997 A1 Jun. 17, 2021

Related U.S. Application Data

(63) Continuation of application No. 15/857,235, filed on Dec. 28, 2017, now Pat. No. 10,933,825.

(51) Int. Cl.
B60R 16/023 (2006.01)
B60P 3/20 (2006.01)
(Continued)

(52) U.S. Cl.
CPC .......... *B60R 16/0237* (2013.01); *B60P 3/20* (2013.01); *B60Q 9/00* (2013.01); *B60R 16/03* (2013.01);
(Continued)

(58) Field of Classification Search
CPC ... B60R 16/0237; B60R 16/033; B60R 16/03; B60P 3/20; B60Q 9/00; G01R 31/382
See application file for complete search history.

(56) References Cited

U.S. PATENT DOCUMENTS 4,874,938 A 10/1989 Chuang
5,154,223 A 10/1992 Ishimaru et al.
(Continued)

FOREIGN PATENT DOCUMENTS

EP 3343728 7/2018
WO 2017/172484 10/2017
(Continued)

OTHER PUBLICATIONS

U.S. Appl. No. 15/386,428, filed Dec. 21, 2016 (19 pages).
(Continued)

*Primary Examiner* — Abby Y Lin
*Assistant Examiner* — Renee LaRose
(74) *Attorney, Agent, or Firm* — Hamre, Schumann, Mueller & Larson, P.C.

(57) ABSTRACT

Methods and systems for efficient power management of a finite power storage unit that provides a finite amount of power to a vehicle accessory are provided. The method includes receiving an input parameter. The input parameter includes one of a desired runtime for the vehicle accessory and a desired condition setting for the vehicle accessory. The method also includes receiving an environment data. Also, the method includes a processor determining an output parameter based on the input parameter and the environment data. The output parameter includes one of an acceptable condition setting for the vehicle accessory and a predicted runtime for the vehicle accessory. Further, the method includes providing the output parameter to a display for displaying the output parameter.

17 Claims, 8 Drawing Sheets

(51) Int. Cl.
*B60Q 9/00* (2006.01)
*B60R 16/033* (2006.01)
*G01R 31/382* (2019.01)
*B60R 16/03* (2006.01)

(52) U.S. Cl.
CPC .......... *B60R 16/033* (2013.01); *G01R 31/382* (2019.01)

(56) References Cited

U.S. PATENT DOCUMENTS

| | | |
|---|---|---|
| 5,162,020 A | 11/1992 | Asano et al. |
| 5,231,849 A | 8/1993 | Rosenblatt |
| 5,333,678 A | 8/1994 | Mellum et al. |
| 5,896,910 A | 4/1999 | Chen |
| 5,947,544 A | 9/1999 | Hubeshi |
| 6,272,873 B1 | 8/2001 | Bass |
| 6,407,365 B1 | 6/2002 | De Pprete, III |
| 6,536,207 B1 | 3/2003 | Kamen et al. |
| 6,644,559 B2 | 11/2003 | Kondo et al. |
| 6,774,636 B2 | 8/2004 | Guiheen et al. |
| 6,811,201 B2 | 11/2004 | Naik |
| 7,145,788 B2 | 12/2006 | Plummer |
| 7,259,469 B2 | 8/2007 | Brummett et al. |
| 8,295,950 B1 | 10/2012 | Wordsworth et al. |
| 8,798,857 B2 | 8/2014 | Waldschmidt et al. |
| 8,876,013 B2 | 11/2014 | Amundson et al. |
| 9,045,018 B2 | 6/2015 | Swanson |
| 9,211,881 B2 | 12/2015 | Waldschmidt et al. |
| 9,582,009 B2 | 2/2017 | Shahapurkar et al. |
| 2004/0169374 A1 | 9/2004 | Wurtele et al. |
| 2007/0052241 A1* | 3/2007 | Pacy ................. B60H 1/00014 290/40 C |
| 2009/0229288 A1 | 9/2009 | Alston et al. |
| 2009/0233759 A1 | 9/2009 | Sheidler et al. |
| 2014/0028268 A1* | 1/2014 | Bourgeois ............. H02J 7/0048 320/156 |
| 2015/0188360 A1* | 7/2015 | Doane ........................ H02J 7/35 307/29 |
| 2015/0258873 A1* | 9/2015 | Swanson ................ H02J 7/1415 701/36 |
| 2016/0202325 A1 | 7/2016 | Tang |
| 2016/0280040 A1* | 9/2016 | Connell ................ G06Q 10/00 |
| 2017/0050592 A1* | 2/2017 | Kloess ................. B60R 16/033 |
| 2017/0096048 A1 | 4/2017 | Larson et al. |
| 2018/0023828 A1* | 1/2018 | Lutz ..................... H04B 1/3822 700/276 |
| 2018/0162301 A1 | 1/2018 | Meng et al. |
| 2020/0091732 A1* | 3/2020 | Park ..................... H02J 7/0014 |

FOREIGN PATENT DOCUMENTS

| | | |
|---|---|---|
| WO | 2018/204591 | 11/2018 |
| WO | 2018/226389 | 12/2018 |
| WO | 2018/226649 | 12/2018 |
| WO | 2018/226848 | 12/2018 |
| WO | 2018/226857 | 12/2018 |
| WO | 2018/226862 | 12/2018 |
| WO | 2018/226906 | 12/2018 |
| WO | 2018/226986 | 12/2018 |

OTHER PUBLICATIONS

"DOE Program on Parasitic Energy Loss Reduction for Class 7/8 Trucks"; Heavy Vehicle Systems Optimization, Caterpillar, Apr. 19, 2006, 20 pages.

"Long-Haul Truck Idling Burns Up Profits"; Energy Efficiency & Renewal Energy, U.S. Department of Energy, 2015, 4 pages.

* cited by examiner

OPERATION OF VEHICLE ACCESSORIES BASED ON PREDICTED RUNTIME OF A PRIMARY SYSTEM

FIELD

This disclosure relates generally to vehicle accessories powered by a finite power storage unit. More specifically, this disclosure relates to methods and systems for setting and automatically controlling a vehicle accessory powered by a finite power storage unit of a vehicle and interfaces for directing this automatic control.

BACKGROUND

Large tractors or trucks (e.g., semi-tractors) are commonly used to transport cargo within a trailer or container. These vehicles may have vehicle accessories which are powered by finite power storage units, for example when the vehicle is stopped. Auxiliary power units (APUs) are an example of a finite power storage unit that can be used with vehicles such as semi-tractors to provide power to vehicle accessories when the primary power source (e.g., tractor engine, high voltage battery source, etc.) is turned off (i.e., deactivated). This can reduce fuel consumption, maintenance costs, emissions, and noise generated by not requiring the tractor main power source to operate (e.g., idle when the main power source is a tractor engine) during occupant rest periods or other periods of vehicle non-movement.

An example of one of the vehicle accessories powered by the APU may be a heating, ventilation, air conditioning and refrigeration (HVACR) system, to maintain an environment setting (e.g., temperature, humidity, airflow, etc.) within the cabin of the tractor. The HVACR system can help maintain a safe and comfortable environment that allows a driver to rest within the sleeper cabin. Other vehicle accessories that can be powered by finite power storage units include, for example, transport refrigeration units, hotel loads such as cabin electronics, entertainment systems and appliances, etc.

BRIEF SUMMARY

This disclosure relates generally to vehicle accessories powered by a finite power storage unit. More specifically, this disclosure relates to methods and systems for setting and automatically controlling a vehicle accessory powered by a finite power storage unit of a vehicle and interfaces for directing this automatic control.

These embodiments can improve management of the load on finite power storage provided by vehicle accessories, allowing drivers to select settings which better match their desired conditions and desired duration of operation of the vehicle accessory.

In some embodiments, methods and systems for setting and automatically controlling a vehicle accessory (such as a heating, ventilation, air conditioning and refrigeration (HVACR) system) powered by a finite power storage unit (such as an auxiliary power unit (APU)) of a vehicle and interfaces for directing this automatic control are provided.

The embodiments described herein can provide feedback to users regarding vehicle accessory function while powered by an APU, for example based on the current level of charge or fuel available to the APU. The feedback may include the amount of time the APU can sustain a level of vehicle accessory function. In an embodiment where the vehicle accessory is an HVACR system, the feedback may include an extent to which the HVACR unit, while powered by the APU, can control a condition such as a cabin temperature for a selected amount of time. This feedback can allow for the effective use of an HVACR unit over the entire course of an occupant rest period within a vehicle, and can allow conditions to be selected with awareness of their impact on system runtime. This can help ensure that acceptable conditions can be maintained even for periods of many hours despite the use of the APU instead of a main power source such as the motor of the tractor.

In one embodiment, a method for efficient power management of a finite power storage unit that provides a finite amount of power to a vehicle accessory is provided. The method includes receiving an input parameter. The input parameter includes one of a desired runtime for the vehicle accessory and a desired condition setting for the vehicle accessory. The method also includes receiving an environment data. Also, the method includes a processor determining an output parameter based on the input parameter and the environment data. The output parameter includes one of an acceptable condition setting for the vehicle accessory and a predicted runtime for the vehicle accessory. Further, the method includes providing the output parameter to a display for displaying the output parameter.

In another embodiment, a finite power storage unit and vehicle accessory system is provided. The system includes a vehicle accessory, a finite power storage unit, an input device and a processor. The finite power storage unit provides a finite amount of power to the vehicle accessory. The input device receives an input parameter. The input parameter includes one of a desired runtime for the vehicle accessory and a desired condition setting for the vehicle accessory. The processor receives an environment data, determines an output parameter based on the input parameter and the environment data, and controls operation of the vehicle accessory based on the output parameter. The output parameter includes one of an acceptable condition setting for the vehicle accessory and a predicted runtime for the vehicle accessor. The processor provides the output parameter to a display for displaying the output parameter.

In yet another embodiment, a user interface for a vehicle accessory powered by a finite power storage unit is provided. The user interface includes a condition setting display, a condition setting control, a runtime display, and a runtime control. The condition setting display shows a condition setting of the vehicle accessory. The condition setting control allows a user to input a desired condition setting of the vehicle accessory. The runtime display shows a runtime of the vehicle accessory when powered by the finite power storage unit. The runtime control allows the user to input a desired runtime for the vehicle accessory. When the user inputs the desired condition setting of the vehicle accessory on the condition setting control, the runtime display is automatically updated based on the desired condition setting to display a predicted runtime of the vehicle accessory to achieve the desired condition setting of the vehicle accessory. When the user inputs the desired runtime of the vehicle accessory on the runtime control, the condition setting display is automatically updated based on the desired runtime to display an acceptable condition setting of the vehicle accessory to achieve the desired runtime of the vehicle accessory.

DETAILED DESCRIPTION

Figure 1:
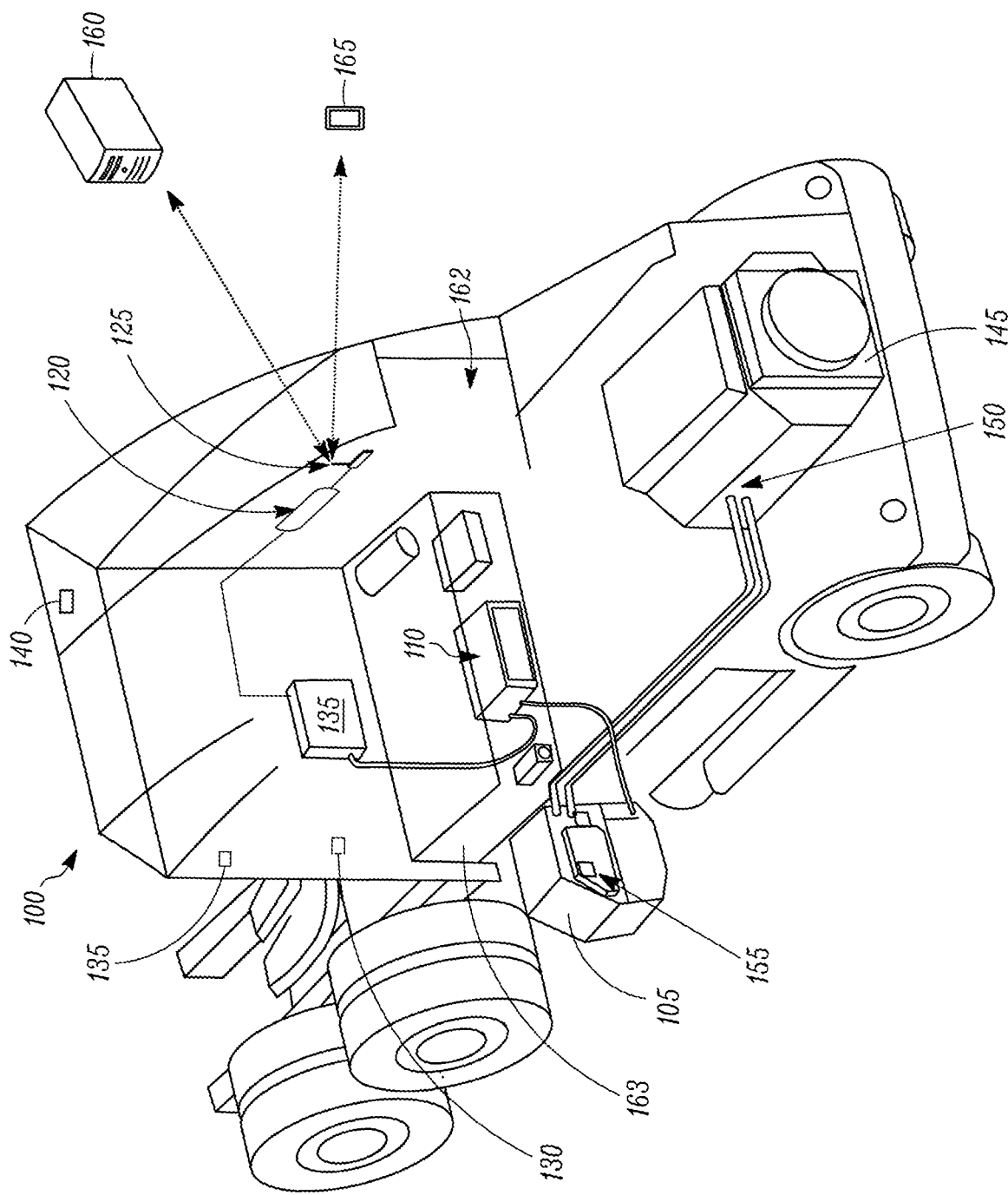
FIG. 1 shows a schematic diagram of an finite power storage unit and vehicle accessory system installed in a semi-tractor, according to one embodiment.

This disclosure relates generally to vehicle accessories powered by a finite power storage unit. More specifically, this disclosure relates to methods and systems for setting and automatically controlling a vehicle accessory powered by a finite power storage unit of a vehicle and interfaces for directing this automatic control.

These embodiments can improve management of the load on finite power storage unit provided by vehicle accessories, allowing drivers to select settings which better match their desired conditions and desired duration of operation of the vehicle accessory.

Also, these embodiments can reduce power consumption of the load to extend run time of the vehicle accessory without increasing the size, weight, or cost of the finite power storage unit. The embodiments described herein can provide efficient charge management and efficient control of the finite power storage unit.

In some embodiments, methods and systems for setting and automatically controlling a vehicle accessory (such as a heating, ventilation, air conditioning and refrigeration (HVACR) system) powered by a finite power storage unit (such as an auxiliary power unit (APU)) of a vehicle and interfaces for directing this automatic control are provided.

The embodiments described herein can provide feedback to users regarding vehicle accessory function while powered by an APU, for example based on the current level of charge or fuel available to the APU. The feedback may include the amount of time the APU can sustain a level of vehicle accessory function. In an embodiment where the vehicle accessory is an HVACR system, the feedback may include an extent to which the HVACR unit, while powered by the APU, can control a condition such as a cabin temperature for a selected amount of time. This feedback can allow for the effective use of an HVACR unit over the entire course of an occupant rest period within a vehicle, and can allow conditions to be selected with awareness of their impact on system runtime. This can help ensure that acceptable conditions can be maintained even for periods of many hours despite the use of the APU instead of a main power source such as the motor of the tractor.

While specific embodiments described below are directed to HVACR systems powered by an APU, it is appreciated that these methods and systems are applicable to various vehicle accessories powered by finite power storage units, including but not limited to transport refrigeration systems and vehicle powered refrigeration and HVAC units. The finite power storage units may include, for example, batteries, including a battery of a main engine of the vehicle when the engine is not in operation, fuel tanks other than the main fuel tank of the vehicle, auxiliary electric power supplies, etc. The vehicle accessories may include a primary system such as a transport refrigeration unit or an HVACR unit as described below. The primary system may be the largest load on the finite power storage unit of the system. The vehicle accessories may further include additional loads, such as hotel loads of a tractor cabin such as electronics, appliances, etc.

An APU may be used, for example, when a tractor is stopped and the driver is resting. In an embodiment, the HVACR system may need to meet a certain runtime goal to ensure that the cabin conditions are maintained for the duration of the stop, for example for an 8-hour period while the driver sleeps. The runtime of the HVACR system is the duration it can operate while being powered by the finite power storage unit of the APU. Runtime of an HVACR system when powered by an APU may be affected by, for example, environmental conditions such as ambient temperatures outside the cabin, or the intensity of sunlight, referred to as solar load, etc. Early termination of APU-powered activities can disrupt rest or cause conditions dangerous to a companion in the cabin. By providing feedback regarding HVACR system settings and runtime, a user can select one or more settings that allow the APU and the HVACR system to meet runtime and condition setting goals and avoid these disruptive or dangerous conditions.

FIG. 1 shows a schematic diagram of a finite power storage unit and vehicle accessory system installed in a semi-tractor 100, according to one embodiment. The finite power storage unit and vehicle accessory system includes an APU 105, an HVACR unit 110 connected to the APU 105, a controller 115, a display 120, and a communications link 125. The finite power storage unit and vehicle accessory system is controlled by the controller 115. The controller 115 is also connected to the APU 105 to control, monitor and receive data from the APU 105. The display 120 is separate from the controller 115. In other embodiments, the display 120 can be part of the controller 115. The controller 115 may also be connected to communications link 125 in order to communicate with a mobile device 165 and/or with a remote server 160. The Finite power storage unit and vehicle accessory system also includes sensors including a cabin temperature sensor 130, an ambient temperature sensor 135, and a solar intensity sensor 140 providing data to the controller 115.

Tractor 100 may have a cabin including a sleeping portion 163 and a driving portion 162 and a plurality of vehicle accessories (not shown). The cabin can be accessible via a driver side door (not shown) and a passenger side door (not shown). The cabin can include a primary HVAC system (not shown) as a vehicle accessory that can be configured to provide conditioned air within driving portion 162 and potentially the entire cabin, and the secondary HVAC system including HVACR unit 110 for providing conditioned air within the sleeping portion 163. The cabin can also include a plurality of cabin accessories (not shown). Examples of cabin accessories can include, for example, sunshade(s) for a window/windshield of the vehicle 100, a refrigerator, a television, a video game console, a microwave, one or more device charging station(s), a continuous positive airway pressure (CPAP) machine, and a coffee maker. The HVACR unit 110 can also be considered as a cabin accessory.

The APU 105 is the finite power storage unit of the embodiment shown in FIG. 1. The APU 105 is a power source that can include a prime mover and/or a power storage device such as a battery to provide power to various loads including the vehicle accessory systems such as HVACR unit 110. The APU 105 may be a separate power source from a primary power source of the vehicle such as an alternator 150 coupled to a main engine 145 and/or the main battery (not shown). The APU 105 can act as a secondary power unit for the semi-tractor 100 for use when the primary power source (e.g., alternator 150 coupled to the main engine 145) is unavailable. When, for example, the primary power source is unavailable, the APU 105 can be configured to provide power to one or more of the vehicle accessories (including, for example, cabin accessories; hotel loads such as, for example, appliances; a primary HVAC system; the HVACR unit 110; a starter for main engine 145; etc.).

In some embodiments, the APU 105 is electrically powered and can include, for example, one or more batteries. In other embodiments, the APU 105 can be mechanically powered, for example, by a prime mover. In one embodiment, the APU 105 can include a prime mover coupled to a belt to drive an alternator and a compressor of the HVACR unit 110. The prime mover of the APU 105 can be separate from the prime mover engine 145 acting as the primary power source of the semi-tractor 100. In some embodiments, the prime mover of the APU 105 can be a diesel engine. The APU 105 can be attached to the semi-tractor 100 using any attachment method such as being located in a compartment, bolted to a portion of the semi-tractor 100, etc.

In some embodiments, the APU 105 can be turned on (i.e., activated) or off (i.e., deactivated) by an occupant (e.g., driver or passenger) of the semi-tractor 100. The APU 105 generally may not be able to provide sufficient power for operating (e.g., driving) the semi-tractor 100.

The APU 105 can have a finite amount of power that it can provide to vehicle accessories, for example, based on a fuel tank providing fuel to the APU 105, storage capability of batteries of the APU 105, etc. The APU 105 may include or be connected to a battery management system 155. The battery management system 155 may, for example, control the charging of a battery of the APU 105 based on parameters such as, for example, battery temperature. The battery management system 155 may, for example, evaluate the remaining useful life of a battery of the APU 105. The battery management system 155 may be directly connected to a battery included in the APU 105 or may communicate with the APU 105 by, for example, a CAN bus, ZigBee, RFID, etc. Components of the APU 105 may have RFID identifiers to provide information regarding part serial number, date of manufacture, etc.

The main engine 145 can provide sufficient power to operate (e.g., drive) the vehicle 100 and any of a plurality of vehicle accessories (e.g., the primary HVAC system) and cabin accessories. In some embodiments, the main engine 145 is the only power source that provides power to the primary HVAC system. The main engine 145 can also provide power to charge, for example, batteries of the APU 105. In some embodiments, the main engine 145 can be a prime mover such as, for example, a diesel engine. In some embodiments, the primary power source 120 can be an electric engine. In some embodiments, the main engine 145 can be a hybrid engine.

The HVACR unit 110 can include a compressor and a fan. The compressor can be part of a refrigeration circuit used to condition air provided to a cabin of the semi-tractor 100. In an embodiment, the compressor is included in the HVACR unit 110. The fan may be an evaporator blower driving air through the cabin of the semi-tractor 100. For example, the fan may drive air through refrigerant coils of an evaporator of the HVACR unit 110. The HVACR unit 110 may also include a heating element (not shown), for example, an electric heating element. The HVACR unit 110 may be a secondary HVACR system. The HVACR unit 110 may be connected to one or more power sources. The one or more power sources can include the APU 105 and may further include the prime mover (e.g., the alternator 150 coupled to the main engine 145) and/or primary battery of the semi-tractor 100, etc.

The controller 115 may include a processor and a memory. The processor may be configured to receive at least one of a condition setting (e.g., a temperature setting, a range of temperatures, a cooling or heating mode, a fan setting, etc.) and a runtime and compute a predicted runtime or condition setting for the HAVCR unit 110 when it is powered by the APU 105. The predicted runtime or condition setting computed by the processor may be based on environment data, such as, for example, a predicted solar load, an ambient temperature for the air outside the cabin of the vehicle, and the condition setting of the HVACR unit 110. The processor may determine a condition setting and/or runtime based on a model correlating vehicle accessory settings and runtime, such as HVACR unit condition setting and runtime. In some embodiments, the model correlating HVACR unit condition setting and runtime may be, for example, a multi-dimensional map of conditions and settings. In some embodiments, the model may be, for example, a physical model wherein the parameters are used to compute the predicted system runtime or system settings based on simulated data. In some embodiments, the model may be, for example, an inbuilt temperature profile, for example based on average temperatures by date, time, and location, and use values from the temperature profile to estimate HVACR loads. In an embodiment, the model is a lookup table. The environment data may include ambient temperature data, temperature within a vehicle cabin data, vehicle location data, APU charge or fuel status data, time of day data, sunrise and/or sunset time data, weather forecast data (e.g., predicted temperature data, predicted precipitation data, predicted solar load data, etc.). In an embodiment, the environment data may be weather forecast data related to, for example, solar load, predicted precipitation and/or temperatures for a time period during which HVACR unit operations will be carried out.

The memory may be configured to store the model correlating HVACR unit condition setting and runtime. The memory may be configured to store environment data that has been received, for example predictions of solar load received from a weather information server via the communications link 125. In an embodiment, data from previous estimations of HVACR unit condition settings and/or runtime may be used to calibrate the model.

The controller 115 may be connected to the communications link 125. In some embodiments, the communications link 125 can be an antenna. In some embodiments, the communications link 125 may be a connection to the internet, such as a cellular data connection such as 3G, 4G or LTE, used to access a remote server 160. In some embodiments, the communications link 125 may connect the controller 115 to a mobile device 165, such as, for example, a cellular phone. In an embodiment, the communications link 125 can be a short-range communications link, such as Bluetooth, Wi-Fi (for example according to an 802.11 standard), ZigBee, or a wired communications link such as a USB link. The short-range communications link may allow communication between the controller 115 and a device such as the mobile phone 165, which may in turn connect to the remote server 160 via the internet, for example, via a cellular data connection.

In an embodiment, a user interface may be presented via the mobile device 165, instead of or in addition to the display 120 discussed in more detail below. In an embodiment, the mobile device 165 may include an application for receiving alerts from the controller 115 and/or providing control information such as an updated temperature target, an updated temperature range, or a time to hit a selected target temperature to the controller 115. The controller 115 may also interface with other computers, for example, to receive data such as weather forecast data. For example, the controller 115 may interface with the remote server 160 that can be a remote server providing weather information, via the internet.

The display 120 may be used to provide a user with information, for example, a selected condition setting and a predicted runtime for that condition setting. The condition setting may be presented on the display 120 as, for example, a single set point temperature, two or more temperatures defining a temperature range for the HVACR unit 110 to operate within, an abstract expression of the condition setting (such as a value from 1-10, a color corresponding to a condition setting such as blue for conditions including colder temperature values or red for conditions including hotter temperature values, etc.), etc. The predicted runtime may be presented as, for example, a dial, a clock, a slider bar, a number, etc. corresponding to the predicted runtime. The display 120 may provide a user interface through which the user views and can manipulate one or more of the runtime and the condition setting values. The display 120 may include a control input, for example a touch-screen for interacting with the presented user interface. Other controls may be provided, for example dials, buttons, knobs, etc. In an embodiment, the display 120 can be a fixed display screen located, for example, in the cabin of the semi-tractor 100. In an embodiment, the display 120 can be the mobile device 165 connected to the controller 115 via the communications link 125.

The finite power storage unit and vehicle accessory system also includes one or more sensors 130, 135 and/or 140 providing data to the controller 115. The sensors 130, 135 and/or 140 may measure conditions relevant to determining HVACR system runtime based on system settings and vice versa. The sensors 130, 135 and/or 140 include the cabin temperature sensor 130 monitoring a temperature within the cabin of the semi-tractor 100, the ambient temperature sensor 135 monitoring a temperature outside the semi-tractor 100, and the solar intensity sensor 140 monitoring a solar load. The sensors 130, 135, and 140 may provide data to the controller 115 through wired or wireless communications methods via, for example, the communications link 125. It will be appreciated that in some embodiments, the finite power storage unit and vehicle accessory system may include only one or two of the sensors 130, 135 and 140. Also, in some embodiments, the finite power storage unit and vehicle accessory system can include additional sensors that can monitor other aspects used by the controller 115 for controlling the finite power storage unit and vehicle accessory system.

Figure 2:
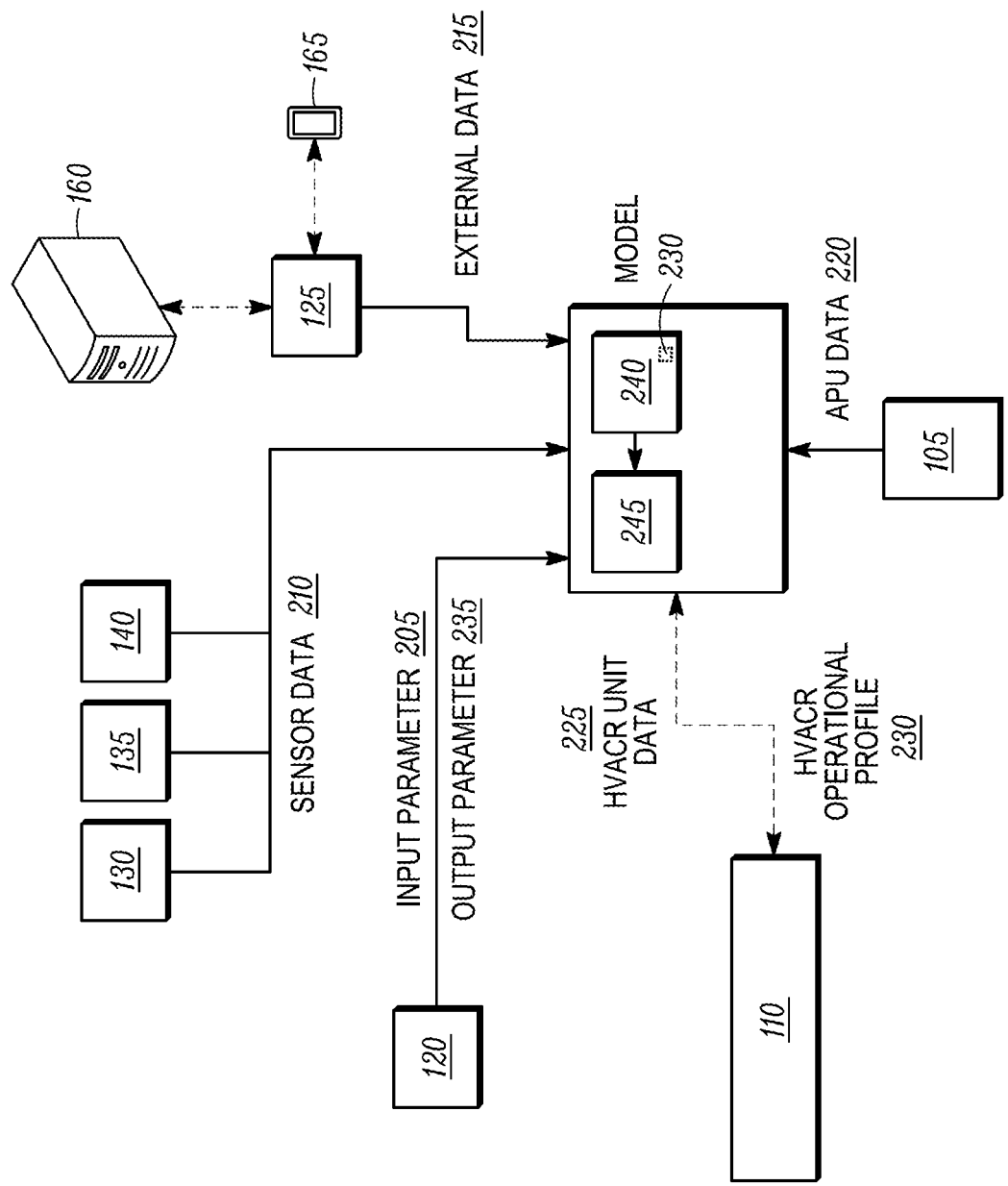
FIG. 2 shows a data flow diagram of a finite power storage unit and vehicle accessory system, according to one embodiment.

FIG. 2 shows one embodiment of a data flow diagram of the finite power storage unit and vehicle accessory system shown in FIG. 1. As shown in FIG. 2, the controller 155 includes a memory 240 and a processor 245. The memory 240 stores a model 230 associating an HVACR system setting with a system runtime based on environment data. The controller 115 retrieves the model 230 from the memory 240 and receives environment data from one or more sources. The environment data may include, for example, APU data 215, HVACR unit data 220, sensor data 205, and external data 210. The controller 115 additionally receives an input parameter 200. The input parameter 200 can include, for example, a desired runtime for the HVACR unit 110, a desired condition setting for the HVACR unit 100, etc. The controller 115 may determine an output parameter 235 at which the HVACR unit 110 may be operated. The output parameter 235 can include, for example, an acceptable condition setting for the HVACR unit 110, a predicted runtime for the HVACR unit 110, etc. For example, when the input parameter 200 is the desired runtime for the HVACR unit 110, the output parameter 235 can be the acceptable condition setting for the HVACR unit 110 to meet the desired runtime for the HVACR unit 110. In another example, when the input parameter 200 is the desired condition setting for the HVACR unit 110, the output parameter 235 can be a predicted runtime for the HVACR unit 110 to meet the desired condition setting for the HVACR unit 110. The output parameter 235 may be provided to the display 120. In an embodiment, the controller 115 may determine an HVACR operational profile 225, which may be communicated to HVACR unit 110.

The APU data 215 is data which is provided by an APU controller, battery management system 155, sensors at the APU 105, etc. to the controller 115. The APU data 215 may be, for example, fuel level data for the APU 105 when it includes a prime mover such as a diesel engine. In an embodiment where the APU 105 includes an electrical storage (e.g., a battery), the APU data 215 may include a state of charge for the electrical storage or related values such as a percentage of full charge, expected battery lifetime, voltage under load, etc. The APU data 215 may include data regarding APU components, such as parts of the battery, collected, for example, via RFID. The data regarding APU components may be, for example, serial numbers, in-service dates, etc. The data regarding battery components may be supplemented with, for example, a database of serial numbers and manufacturing dates to provide an age of the APU components, or a database of previous uses of an APU component. The APU data 215 may include data from a battery management system 155, for example a battery condition monitor or a charging control system. The battery management system 155 may be integral to the APU 105, or may include parts separate from the APU 105.

The HVACR unit data 220 may be provided by an HVACR unit controller or sensors at the HVACR unit 110, such as diagnostic sensors. The HVACR unit data may include stored performance parameters, expected efficiency data based on the diagnostic sensors, or other data relating to performance of the HVACR unit 110.

The sensor data 205 may be data generated by environmental sensors and other devices located on or near the semi-tractor 100, and can include, for example, cabin temperature data obtained from the cabin temperature sensor 130, ambient temperature data obtained from the ambient temperature sensor 135, current solar load data obtained by the solar intensity sensor 140 on an exterior of the semi-tractor 100, time data from a vehicle clock, etc. Solar intensity sensor 140 may be, for example, a photo sensor and/or a solar cell.

The external data 210 may include data obtained from the internet, for example, from a weather data server providing, for example, National Oceanic and Atmospheric Administration (NOAA) weather data and/or forecasts, or from a server providing, for example, model calibration data, etc. Weather data may include, for example, forecasts of temperature, precipitation, and/or solar load. The external data 210 may also include, for example, time data, sunrise and sunset time data, update data such as updates to HVACR unit data 220 and/or the model 230 associating an HVACR system setting with a system runtime based on environment data. The external data 210 may be received via the communications link 125. External data 210 may include calibration data, for example determined based on analysis of prior predictions of system runtime and/or HVACR system condition settings. Model calibration data may be, for example, updates to a multi-dimensional map associating system runtime and system settings, or changes to parameters used in performing simulations in a physical model.

The model 230 associating an HVACR system setting with a system runtime based on environment data may be stored in the memory 240 of the controller 115. The model 23 can be provided to the controller 115 when determining, for example, operational parameters of the finite power storage unit and vehicle accessory system. The model 230 may be, for example, a sensitivity map associating system runtime and system settings and weighting the impact of the environment data on the relationship between system settings and runtime. The model 230 may be a multi-dimensional model wherein the environment data are represented as the dimensions and individual points correspond to system runtime or system settings. The model 230 may be calibrated based on data regarding prior predictions of system runtime and/or HVACR system condition settings.

The input parameter 200 may be received through the user interface, such as the display 120 and surrounding controls, or by the mobile device 165 connected via the communications link 125. The input parameter 200 may be user input such as, for example, a desired condition setting or a desired runtime (e.g., the amount of time a driver plans to sleep in the cabin, etc.). The input parameter 200 is provided to the controller 115 so that the output parameter 235 may be determined based on the model 230 and the environment data including the external data 210, the APU data 215, the HVACR unit data 220 and/or the sensor data 205.

The output parameter 235 is determined by the processor 245 in the controller 115 based on the input parameter 200, the model 230 and the environment data. The output parameter 235 may be at least one of an acceptable condition setting or a predicted runtime for the HVACR unit 110. The output parameter 235 may be an acceptable condition setting when a desired runtime is the input parameter 200. The output parameter 235 may be a predicted runtime when a desired condition setting is the input parameter 200. The output parameter 235 is provided, for example, by a wired and/or wireless communication, to the display 120, where it is presented to the user. In an embodiment, the user may enter a new input parameter 200 upon viewing the output parameter 235 presented on the display 120. For example, if the user determines that the output parameter 235 is not acceptable, such as a predicted runtime that does not match a desired rest period for the user, the user may enter a new input parameter 200.

The controller 115 may provide an HVACR operational profile 230 to the HVACR unit 110. The HVACR operational profile 230 may be control data for directing the operation of the HVACR unit 110, for example, a set point temperature or range of temperatures to maintain within the cabin, an acceptable range of deviation from the set point temperature, times and/or capacities at which to run a compressor and/or a fan of HVACR unit 110, etc.

Figure 3:
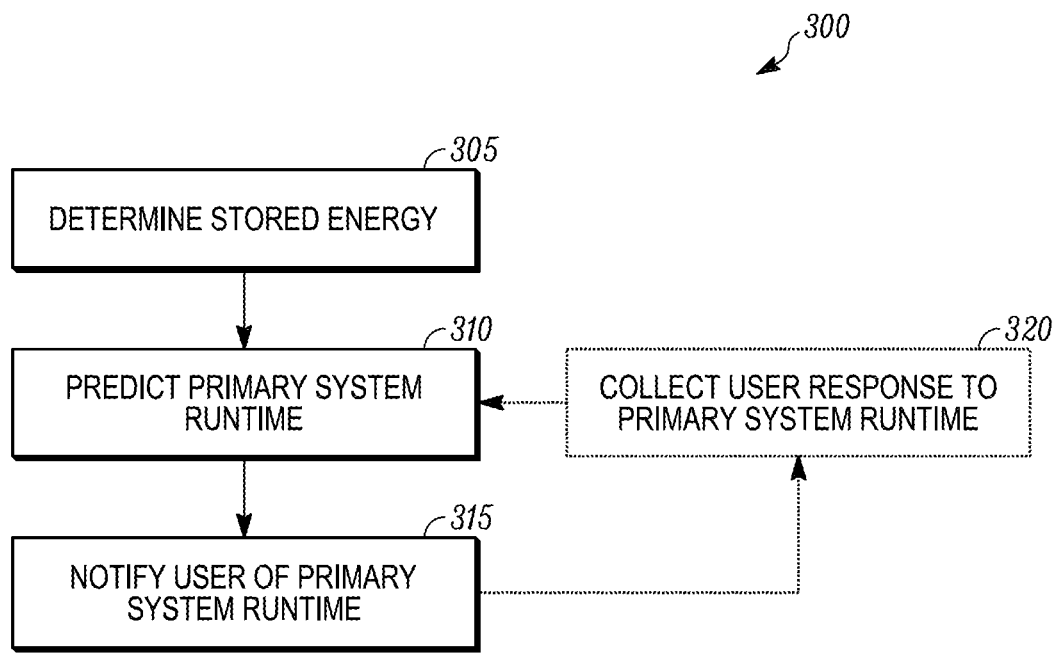
FIG. 3 shows a flowchart of a method for controlling the use of a primary system based on predicted runtime of the primary system, according to one embodiment.

FIG. 3 shows a flowchart of a method 300 for managing the use of one or more vehicle accessories powered by a finite power storage unit (e.g., the APU 105 shown in FIG. 1), where the finite power storage unit is a battery. In method 300, the stored energy of the finite power storage unit is determined 305, the run-time of a primary system powered by the finite power storage unit such as an HVACR system is predicted 310, and a user is notified of the estimated run-time 315.

Figure 4:
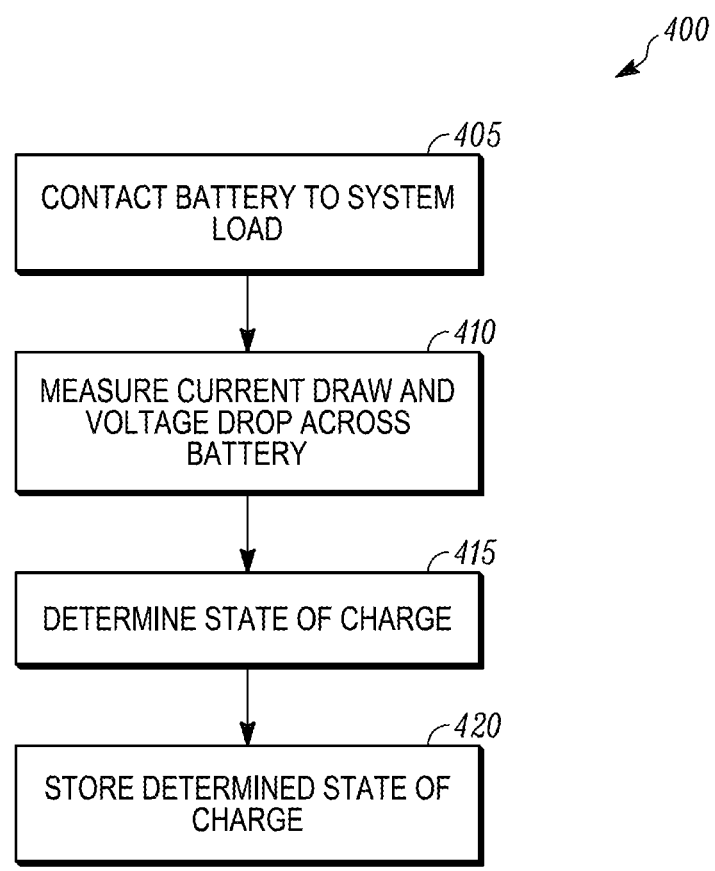
FIG. 4 shows a flowchart of a method for determining a state of charge of a battery, according to one embodiment.
Figure 5:
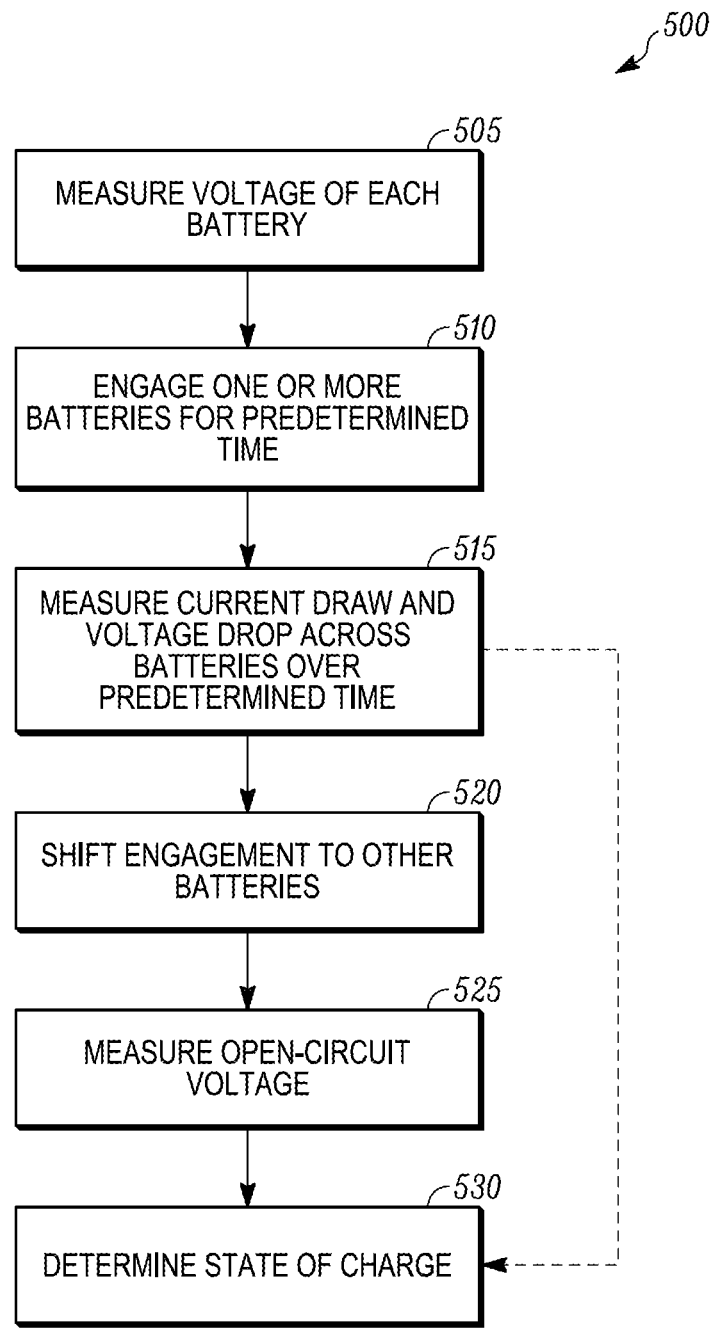
FIG. 5 shows a flowchart of a method for determining a state of charge for a finite power storage unit embodiment having multiple batteries, according to one embodiment.

At 305, the stored energy of the finite power storage unit is determined. The stored energy of the finite power storage unit may be, for example, a fuel level of a fuel tank or a state of charge of a battery. The stored energy of the finite power storage unit may be determined by, for example, a fuel meter measuring a fuel level of the finite power storage unit. In an embodiment, the stored energy of the finite power storage unit is a state of charge of one or more batteries, which may be measured by, for example, battery management system 155. Examples of state of charge determinations for one or more batteries of a finite power storage unit are shown in FIGS. 4 and 5. The method 300 then proceeds to 310.

FIG. 4 shows a method 400 for determining a state of charge of a battery of a finite power storage unit. The method of FIG. 4 may be used in, for example, battery management system 155. The method 400 includes connecting a battery to a system load 405, measuring the current draw and voltage drop 410, determining state of charge based on the 415, and storing the determined state of charge 420.

At 405, the battery of a finite power storage unit is connected to a system load. The finite power storage unit may include one or more batteries. The battery supplies power to the system load when they are connected at 405.

At 410, when the battery and the system load are connected, there is a current flow from the battery and a voltage drop across the battery. The current draw and voltage drop across the battery once the load is connected are measured. The current draw and voltage drop can be measured using one or more sensors. The one or more sensors may be part of a battery management system 155.

At 415, the current flow from the battery and the voltage drop across the battery can be used to determine a state of charge of the battery. Determining a state of charge of the battery may include referencing a model correlating voltage drop and current draw with a state of charge. An example of a model correlating voltage drop and current draw is a physical model of the battery or a database such as a lookup table.

At 420, the determined state of charge is stored in a memory (e.g., the memory 240 shown in FIG. 2). The determined state of charge may be stored in a non-volatile memory for reference, for example for use as the APU data in an embodiment where an APU powers an HVACR unit.

FIG. 5 shows a method 500 for determining the state of charge of batteries in a finite power storage unit having multiple batteries.

The voltage of each of the batteries of the finite power storage unit is measured 505. The measurement of each battery 505 is a measurement of the voltage across that battery when no load is applied to that particular battery. The values obtained when each battery voltage is measured 505 may be stored, for example for comparison with the open circuit voltages of the batteries measured at 525.

At 510, one or more of the batteries of the finite power storage unit are engaged to a system load for a predetermined amount of time. The one or more batteries are engaged to the system load by electrically connecting the one or more batteries to the load, and operating the load. The predetermined amount of time is at least the time it takes for the load to cause a voltage drop across the battery. The predetermined amount of time may be variable depending on the load and variation in the load. In an embodiment, engaging one or more of the batteries of the finite power storage unit to a system load 510 occurs during ordinary operation of the load (i.e. operating an HVAC system or a TRU). In an embodiment, engaging one or more of the batteries of the finite power storage unit to a system load 510 occurs during a defined battery testing sequence. The one or more batteries may be only some of the batteries included in the finite power storage unit. During this predetermined amount of time, current draw and voltage drop across the batteries is measured 515.

At 515, during this predetermined amount of time, a current draw and voltage drop across the one or more batteries is measured using a current sensor located between the one or more batteries and voltage sensors measuring the voltage across each of the one or more batteries. In an embodiment, the method may proceed directly from measuring current draw and voltage drop 515 to determining the state of charge 530 using the voltage drop and current draw measured in this step.

At 520, the engagement of batteries to the load is shifted to one or more batteries other than those engaged in 510. The engagement of batteries is shifted 520 by removing the batteries connected to the load in 510 from the load, and engaging batteries which were not previously engaged with the load in 510.

At 525, the open circuit voltage of the batteries engaged at 510 is measured. The open circuit voltage is the voltage across the battery once the load has been removed from that battery in 520. The open circuit voltage is measured using voltage sensors across the batter that has been removed from the load.

The state of charge of the battery is determined 530. The state of charge of the battery may be determined 530 based on the open circuit voltage, for example using a model correlating open circuit voltage and state of charge, such as a lookup table. In an embodiment, determining the state of charge of the battery 530 is performed by using the voltage drop and/or current draw measured at 515 and a lookup table to provide a value of the state of charge. Shifting of engagement 520, measurement of open circuit voltage 525, and determining the state of charge 530 may be iterated to measure state of charge for batteries not engaged in 510.

Returning to FIG. 3, at 310 the runtime of a primary system is estimated. The primary system is a system drawing power from the finite power storage unit, for example an HVACR unit or a TRU. The runtime may be estimated based on user input regarding the operation of the primary system, such as temperature settings for a TRU or an HVACR unit, a cargo identifier for a TRU, an operational mode for an HVACR unit, etc. The runtime may be estimated based on data regarding current and/or forecast ambient conditions, such as temperature and solar load, the stored energy determined at 305, and a model correlating the settings of the primary system, the stored energy, and the ambient conditions with a runtime for the primary system. The model may be a physical model, a lookup table, a multi-dimensional model, etc.

At 315, a user is notified of the estimated runtime. The user can be notified of the runtime via a display, such as display 120 or mobile device 165 shown in FIGS. 1 and 2. The runtime may be presented via a user interface. Optionally, the user may respond to the predicted runtime provided in 315, and a user response may be collected 320. The user response collected in 320 may include, for example, changing the desired operation of the primary system such as an HVACR system, or additional systems such as hotel loads including refrigerators, entertainment systems, etc. The user response 320 may be used when returning the method 300 to 310, estimating the runtime of the primary system based on the new input collected at 320. An example embodiment of estimating runtime and notifying the user is provided in FIG. 6.

Figure 6:
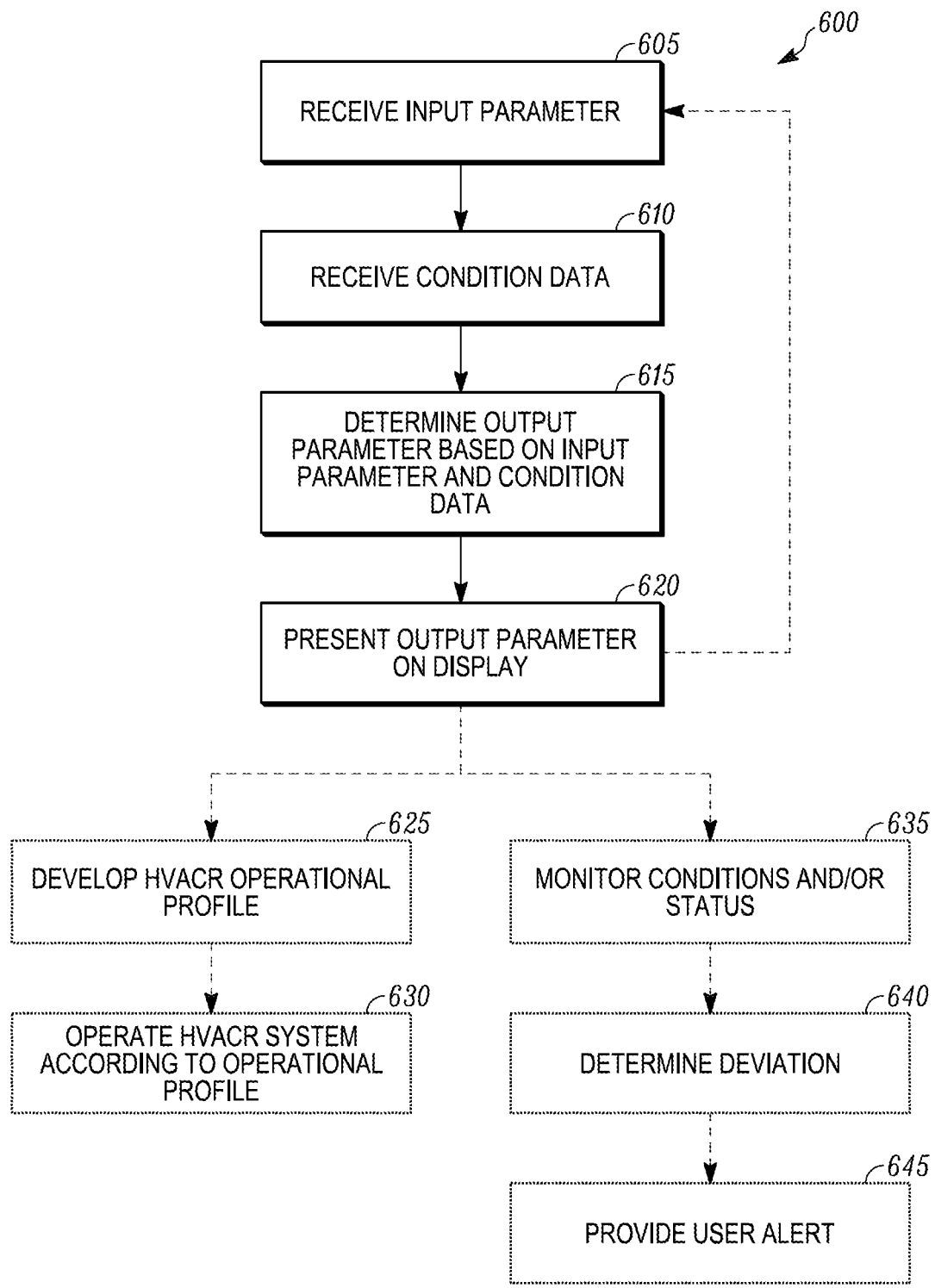
FIG. 6 shows a flowchart of a method for predicting runtime for a primary system and presenting the prediction to a user, according to one embodiment.

FIG. 6 shows a flowchart of a method 600 for determining operational parameters of an HVACR unit (e.g., the HVACR unit 110 shown in FIG. 1), according to one embodiment. The method 600 may be used in the system shown in FIGS. 1 and 2. The method 600 may be carried out by a controller (e.g., the controller 115 shown in FIG. 1). This method 600 may be used for other finite power storage units and other vehicle accessories, for example where the vehicle accessory is a transport refrigeration unit or a set of hotel loads such as a refrigerator and an entertainment system. The method 600 may also be used in conjunction with the method 300 to estimate a runtime of a primary system at 310 and notify the user of the estimated runtime at 315 as shown in FIG. 3.

An input parameter (e.g., the input parameter 200 shown in FIG. 2) is received at 605. The input parameter may be a desired runtime for the vehicle accessory such as an HVACR unit or a condition setting for the vehicle accessory such as an HVACR unit. The input parameter may be input via a user interface or via controls in proximity to a user interface, for example, knobs or buttons or touch-screen interfaces. In an embodiment, a mode is selected which determines which of the runtime or the condition setting is the input parameter. In an embodiment, the input parameter is determined based on the control being manipulated. When the input parameter is a condition setting for an HVACR unit, the condition setting may be, for example, a temperature set point, a range of temperatures to maintain, or an abstract representation of heating or cooling such as a 1-10 scale or colors corresponding to hot and cold, such as blue for cold and red for hot, fan speed, etc. Where the input parameter is a condition setting for a transport refrigeration unit (TRU), the input parameter 80 may be, for example, a temperature set point, a type of cargo in the TRU, etc. When the input parameter is a desired runtime, the desired runtime may be expressed as, for example a period of time or as a desired time for the HVACR unit to operate until. In an embodiment, a mode of operation, such as operation in a companion mode, may also be received.

Environment data (e.g., APU data 215, HVACR unit data 220, sensor data 205 and/or external data 210 in the embodiment shown in FIG. 2) is received at 610. Environment data may be received before, after, or concurrently with receiving the input parameter at 605. The environment data may include data used to determine the output parameter based on the input parameter and a model correlating condition settings and HVACR system runtimes when utilizing APU power. The environment data may include ambient temperature, temperature within a vehicle cabin, vehicle location data, APU charge and/or fuel status, time of day, sunrise and/or sunset times, weather forecast information such as predicted temperatures, predicted precipitation, predicted solar loads, etc. Ambient and in-cabin temperature data may be received, for example, via a sensor connected to the controller, or, for example, by current temperature readings according to current local weather data, for example obtained from the internet via a communications link such as a cellular data connection. Time and/or date data may be, for example, from a clock included in the controller or in the vehicle. Weather data may be example obtained from the internet via a communications link such as a cellular data connection, for example using private servers hosting such data, established news and/or weather services, NOAA, etc. APU charge or fuel status may be received from sensors included in the APU such as a charge monitor on a battery or a fuel gauge on a prime mover such as a generator. Vehicle location data may be obtained through, for example, a GPS system included in the vehicle, for example as part of a navigation or delivery tracking system. In an embodiment, the data collected at 610 can be stored in a memory, for example, to determine if changes subsequently occur to the environment data or if the environment data deviates from predicted values such as forecasts that were used when determining the output parameter. In an embodiment where the HVACR system is being operated in a delayed mode where the system is operated during a future time period, the environment data that is received at 610 may be forecast data relating to the future time period during which the delayed HVACR system operations are scheduled. In an embodiment, environment data may be adjusted based on the orientation of the vehicle. For example, solar load can be adjusted by a factor based on the exposure of the cabin to sunlight based on the orientation of the vehicle and the position of the sun in the sky. Vehicle orientation may be determined by, for example, inbuilt compass, GPS, etc.

The input parameter and the environment data are used to determine a value of an output parameter (e.g., the output parameter 235 shown in FIG. 2) at 615. For example, the input parameter and the environment data may be input into a model correlating system setting and runtime based on current and predicted conditions. The model correlating system setting and runtime based on current and predicted conditions may be, for example, a sensitivity map associating system runtime and system settings and weighting the impact of the environment data on the relationship between system settings and runtime. The model correlating system setting and runtime based on current and predicted conditions may be a multi-dimensional model wherein the environment data are represented as the dimensions and individual points correspond to system runtime or system settings. In an embodiment, the model is a physical model, and the input parameter and the environment data may be used to run one or more simulations to determine the output parameter.

The output parameter is presented to a user at 620. The output parameter may be a condition setting or a predicted runtime for the vehicle accessory such as an HVACR unit. The output parameter is different than the input parameter entered at 80. Where the output parameter is a condition setting, the output parameter may be displayed as, for example, a temperature set point, a range of temperatures to maintain, an abstract representation of heating or cooling such as a 1-10 scale or colors corresponding to hot and cold, such as blue for cold and red for hot. Where the output parameter is a predicted HVACR unit runtime, the output parameter may be displayed as, for example, an amount of time the HVACR unit may operate, a predicted time the HVACR unit can be run until, etc. The display may be, for example, a display located within the vehicle or may be the display of, for example, a mobile device connected to the system through a wired (i.e. USB, Lightning, etc.) or wireless (i.e. 802.11, ZigBee, Bluetooth, etc.) connection. In an embodiment, when the output parameter is presented on a display 620, an input parameter may be adjusted or a new input parameter entered, and if an input parameter is received 605, method 600 iterates again with the newest input parameter.

Optionally, an operational profile may be developed based on the input parameter, the output parameter, and the environment data at 625. The HVACR unit operated according to the operational profile at 630. Optionally, cabin conditions, HVACR status, and/or APU status can be monitored at 635. A deviation from the input or output parameter may be detected or predicted at 640. If a deviation is detected or predicted at 640, an alert can be provided to a user at 645.

The operational profile may include, for example, a range of temperatures to maintain or a temperature set point and an acceptable deviation from that set point, or determining a capacity at which to operate a compressor or heating element and a fan of the HVACR unit over time. The HVACR unit may be operated according to that operational profile at 630, maintaining the desired range of temperatures or operating HVACR unit components such as a compressor, fan, and/or heating element at the determined capacities to provide the condition setting within the vehicle cabin for the runtime.

Optionally, cabin conditions, HVACR operational data, and environment data may be monitored at 635, and if a deviation from the input or output parameter is detected in 640, an alert may be generated and provided to a user in 645.

Cabin environment data may be monitored 635 by, for example, temperature sensors in the cabin. Environment data may be monitored 635 by, for example, regularly sampling external data sources such as weather forecasts and, for example, comparing the data sampled from the external data sources to stored data from the determination of the output parameter in 610 or the provision of the most recent alert 645.

In an embodiment, a deviation is determined 640 by comparing cabin environment data collected at 635 to the condition setting. In an embodiment, a deviation is determined 640 by inputting updated environment data from 635 into the model to determine whether the correlation between input parameter and output parameter has changed based on the deviation of the environment data.

An alert may be provided to a user 645 if the correlation between the input parameter and the output parameter has changed. In an embodiment, if the correlation between the input parameter and the output parameter has changed based on the deviation of the environment data, the runtime may be determined based on the condition setting, and an alarm may be provided only if the runtime has decreased from the runtime that was the input parameter or the output parameter. The alert may be presented, for example, via a display within the cabin, or via a mobile device connected to the system, for example through a wired (i.e. USB, Lightning, etc.) or wireless (i.e. 802.11, ZigBee, Bluetooth, etc.) connection. In an embodiment, the alert is a notification in a mobile device application. In an embodiment, the alert is an automatically generated text message to a mobile device.

The alert provided in 645 may be informational, expressing a change to condition setting or runtime, or may solicit a user response, for example a reply to an automated text or interaction with a user interface in a mobile device application or a mobile-accessible website. The user response may be, for example, an update to the condition setting or the runtime setting. The update to the condition setting or runtime setting may iterate this process, with the temperature or runtime setting being the input data, and with output data computed based on the current environment data and the input data.

In an embodiment, the monitoring 635 or the alert 645 may only occur only in certain operating modes. For example, monitoring 635 and alerts 645 may occur during a "companion mode" for use when a driver leaves a vehicle but an animal requiring certain temperatures and amounts of ventilation remains within the vehicle cabin. Monitoring 635 and alert 645 may be in addition to determining an operational profile 625 and operating the HVACR unit in accordance with that operational profile 630.

Figure 7:
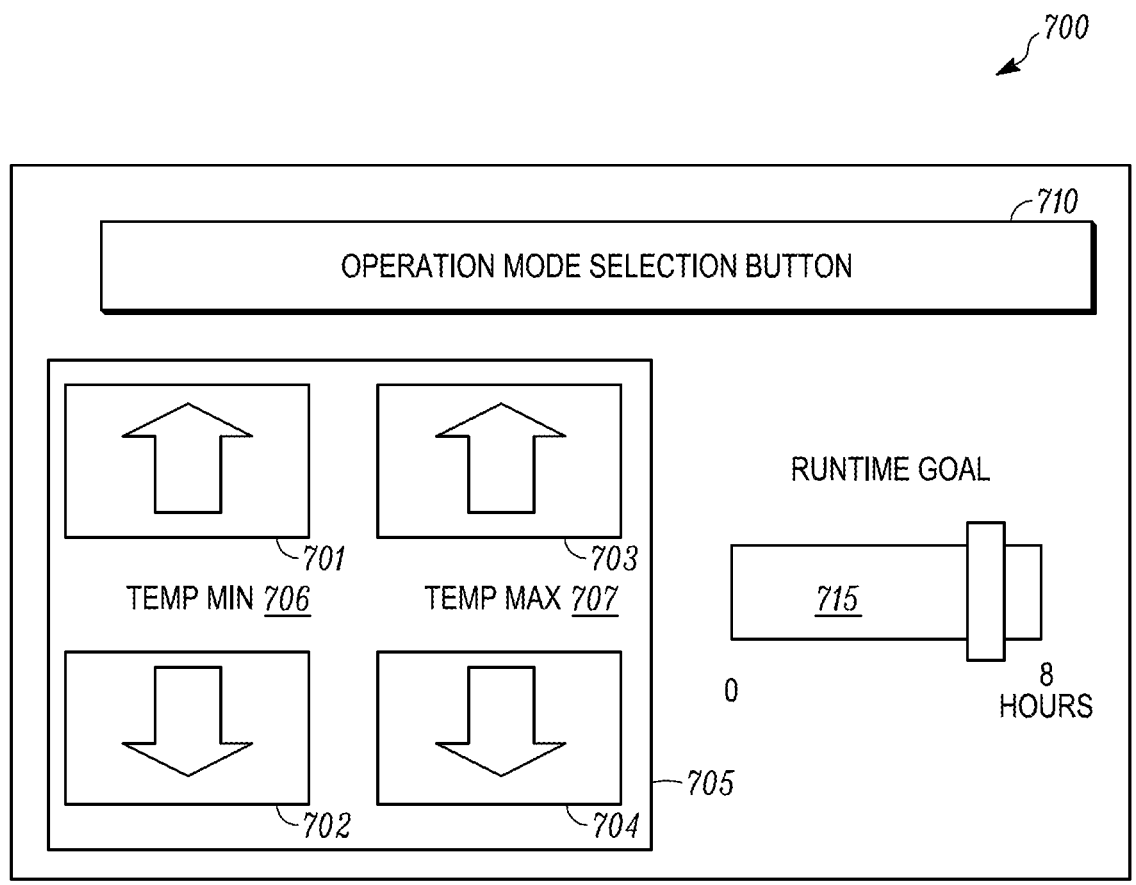
FIG. 7 shows a user interface for an embodiment where a vehicle accessory is powered by a finite power storage unit.

FIG. 7 shows one embodiment of a user interface 700 for managing a vehicle accessory powered by a finite power storage unit. The user interface 700 includes a condition setting display/control 705, an operating mode selection 710 and a runtime display/control 715. The user interface 700 can be controlled by a controller (e.g., the controller 115 shown in FIGS. 1 and 2).

The user interface 700 may be presented on, for example, a display (e.g., the display 120 shown in FIG. 1), a mobile device (e.g., the mobile device 165 shown in FIG. 1), etc. The user interface 700 may receive input via, for example, a touch-screen of the display or mobile device, or controls located on or near the display, for example a keyboard and mouse, track-ball, knobs or dials, etc.

The condition setting display/control 705 is a display that shows a condition setting of a primary vehicle accessory and a control that allows a user to input a desired condition setting of the primary vehicle accessory. In some embodiments, the primary vehicle accessory can be a load connected to the finite power storage unit that draws the most power of the multiple vehicle accessories. The primary vehicle accessory may be, for example, an HVACR unit, a transport refrigeration unit, etc. The configuration of the condition setting display/control 705 may be based on the type of primary vehicle accessory.

In the embodiment shown in FIG. 7, the condition setting display/control 705 is a temperature display/control that includes controls 701, 702, 703, 704, a minimum temperature display 706 and a maximum temperature display 707. The temperature display/control can be used, for example, to control and monitor a cabin temperature for a tractor when the primary vehicle accessory is a HVACR unit, an internal space of a transport unit when the primary vehicle accessory is a transport refrigeration unit, etc. The control 701 allows a user to increase a minimum desired setpoint temperature. The control 702 allows a user to increase a minimum desired setpoint temperature. The control 703 allows a user to increase a maximum desired setpoint temperature. The control 704 allows a user to decrease the maximum desired setpoint temperature. The minimum temperature display 706 can display a minimum desired setpoint temperature or an estimated minimum acceptable setpoint temperature. The maximum temperature display 707 can display a maximum desired setpoint temperature or an estimated maximum acceptable setpoint temperature. The temperature displays 706, 707 can display a numerical temperature value, an abstract temperature value (e.g., a word such as hot, warm, cold; a color such as blue for cold or red for hot), etc.

The runtime display/control 715 provides a user with an estimate of predicted runtime of the primary vehicle accessory and allows the user to input a desired runtime of the primary vehicle accessory. The runtime may be displayed as a number of hours the primary vehicle accessory can be maintained by the finite power storage unit. As shown in FIG. 7, the runtime input/output 715 is a slider bar that displays a desired time and/or a predicted time over which the primary vehicle accessory can be operated. It will be appreciated that in other embodiments, the slider bar can be replaced with other display/control schemes including a scheme similar to the condition setting display/control 705, a dial, a clock indicative of a desired time or a predicted time over which the primary vehicle accessory can be operated, etc. The value of the displayed runtime may be adjusted, for example, by a user by: moving the position of the slider, by using an external control to select a value, etc.

When a user adjusts the condition setting control/display 705 (e.g., via the controls 701-704), a controller can automatically instruct the user interface 700 to adjust the runtime display/control 715 to display a predicted runtime of the primary vehicle accessory based on the user inputted desired condition setting. In some embodiments, the runtime display/control 715 is automatically adjusted based on environment data as well. For example, when a user adjusts the minimum temperature using controls 701 and 702 or adjusts the maximum temperature using the controls 703 and 704, the slider bar of the runtime display/control 715 is automatically adjusted to display the predicted runtime of the primary vehicle accessory to achieve the desired minimum and maximum temperatures. The user interface 700 can also interact with the controller to allow the controller to control the primary vehicle accessory to achieve the desired minimum and maximum temperatures inputted by the user.

Similarly, when a user adjusts the runtime control/display 715 (e.g., via the slider bar), the controller can automatically instruct the user interface 700 to adjust the condition setting display/control 705 to display an acceptable condition setting based on the user inputted desired runtime setting. In some embodiments, the condition setting display/control 705 is automatically adjusted based on environment data as well. For example, when a user adjusts the runtime control/display 715 (e.g., the slider bar), the displays 706 and 707 of the condition setting display/control 705 are automatically adjusted to display an acceptable minimum and maximum temperature of the primary vehicle accessory to achieve the desired runtime of the primary vehicle accessory. The user interface 700 can also interact with the controller to allow the controller to control the primary vehicle accessory at the acceptable minimum and maximum temperatures.

In some embodiments, the user interface 700 can also include a confirmation input (not shown) that is inputted by the user before the controller automatically instructs the user interface 700 to adjust the condition setting control/display 705 and/or the runtime control/display 715.

The operating mode selection 710 allows a user to select a particular mode of operation of the vehicle accessory. When the vehicle accessory is a HVACR unit, the operating mode selection 710 can allow a user to select from, for example, a fixed runtime target mode, a fixed temperature target mode, a companion mode, a delay mode, a no alarm mode, a remote operation mode, or other modes of operation for the user interface 700. In some embodiments, the operating mode selection 710 can allow a user to select operation modes of an APU (e.g., the APU 105 shown in FIGS. 1 and 2) and/or an HVACR unit (e.g., the HVACR unit 110 shown in FIGS. 1 and 2), etc.

In an embodiment, the companion mode may be a mode operating the HVACR unit when the driver may not be in the cabin but control of cabin climate is still required, for example, due to a pet in the cabin. The companion mode may be, for example, a mode where the condition setting may correspond to wider ranges of allowable temperatures, or a maximum allowable temperature for a condition setting may be higher than during other HVACR operations. The companion mode may additionally allow alerts and remote commands to be provided via, for example, a mobile device interfacing with a controller (e.g., the controller 115 shown in FIGS. 1 and 2) via a communications link (e.g., the communications link 125 shown in FIGS. 1 and 2).

In an embodiment, the fixed runtime mode allows the condition setting to be selectable within boundaries based on a target runtime.

In an embodiment, the fixed condition setting mode allows the target runtime to be set for a constant condition setting. The target runtime may be used to determine an operational profile for the HVACR unit to follow for the condition setting. In an embodiment, the selection of a target runtime for a fixed condition setting can be used to determine upper and lower bounds around the fixed condition setting.

In an embodiment, the delay mode can delay activation of the HVACR unit until a predetermined time. For example, the delay mode may include setting a time at which to achieve a certain temperature within the cabin.

In an embodiment, the no-alarm mode can disable one or more alerts so as not to disrupt the rest of someone in the cabin.

In an embodiment, the remote operation mode selection can allow the vehicle accessory to be activated in response to a signal (e.g., via the communications link 125 shown in FIGS. 1 and 2) from a server, a mobile device, etc.

In the embodiment shown in FIG. 7, the operating mode selection 710 is a button which may provide a drop-down menu listing the potential operating modes and allowing selection of an operating mode.

Figure 8:
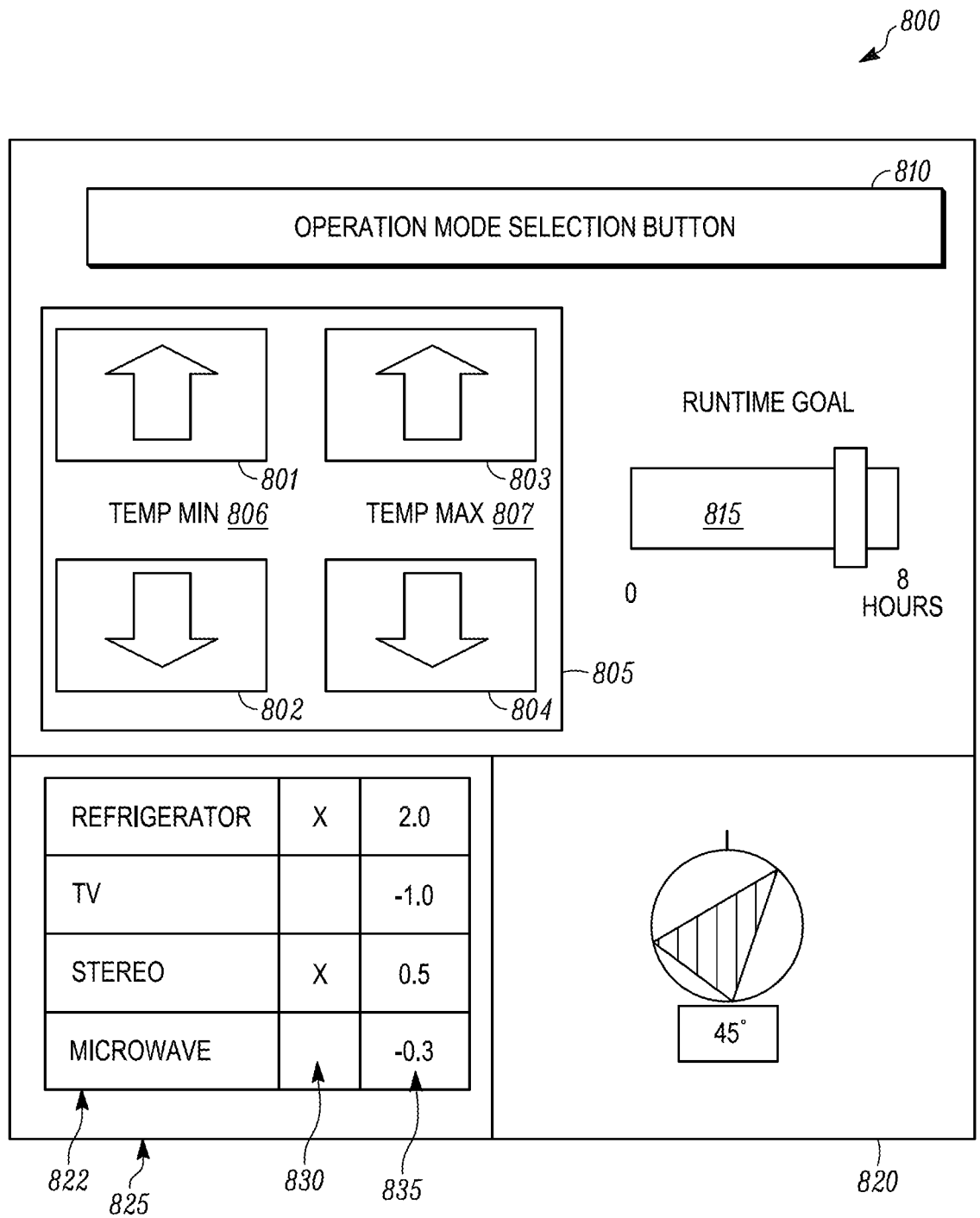
FIG. 8 shows a user interface for an embodiment where multiple vehicle accessories are powered by a finite power storage unit.

FIG. 8 shows one embodiment of a user interface 800 for managing multiple vehicle accessories powered by a finite power storage unit and providing recommendations for improving the management of the multiple vehicle accessories. The user interface 800 includes a condition setting display/control 805, an operating mode selection 810, a runtime display/control 815, an orientation display 820, and an additional vehicle accessories display/control 825. The user interface 800 can be controlled by a controller (e.g., the controller 115 shown in FIGS. 1 and 2).

The user interface 800 may be presented on, for example, a display (e.g., the display 120 shown in FIG. 1), a mobile device (e.g., the mobile device 165 shown in FIG. 1), etc. The user interface 800 may receive input via, for example, a touch-screen of the display or mobile device, or controls located on or near the display, for example a keyboard and mouse, track-ball, knobs or dials, etc.

The condition setting display/control 805 is a display that shows a condition setting of a primary vehicle accessory and a control that allows a user to input a desired condition setting of the primary vehicle accessory. In some embodiments, the primary vehicle accessory can be a load connected to the finite power storage unit that draws the most power of the multiple vehicle accessories. The primary vehicle accessory may be, for example, an HVACR unit, a transport refrigeration unit, etc. The configuration of the condition setting display/control 805 may be based on the type of primary vehicle accessory.

In the embodiment shown in FIG. 8, the condition setting display/control 805 is a temperature display/control that includes controls 801, 802, 803, 804, a minimum temperature display 806 and a maximum temperature display 807. The temperature display/control can be used, for example, to control and monitor a cabin temperature for a tractor when the primary vehicle accessory is a HVACR unit, an internal space of a transport unit when the primary vehicle accessory is a transport refrigeration unit, etc. The control 801 allows a user to increase a minimum desired setpoint temperature. The control 802 allows a user to increase a minimum desired setpoint temperature. The control 803 allows a user to increase a maximum desired setpoint temperature. The control 804 allows a user to decrease the maximum desired setpoint temperature. The minimum temperature display 806 can display a minimum desired setpoint temperature or an estimated minimum acceptable setpoint temperature. The maximum temperature display 807 can display a maximum desired setpoint temperature or an estimated maximum acceptable setpoint temperature. The temperature displays 806, 807 can display a numerical temperature value, an abstract temperature value (e.g., a word such as hot, warm, cold; a color such as blue for cold or red for hot), etc.

The runtime display/control 815 provides a user with an estimate of predicted runtime of the primary vehicle accessory and allows the user to input a desired runtime of the primary vehicle accessory. The runtime may be displayed as a number of hours the primary vehicle accessory can be maintained by the finite power storage unit. As shown in FIG. 8, the runtime input/output 815 is a slider bar that displays a desired time and/or a predicted time over which the primary vehicle accessory can be operated. It will be appreciated that in other embodiments, the slider bar can be replaced with other display/control schemes including a scheme similar to the condition setting display/control 805, a dial, a clock indicative of a desired time or a predicted time over which the primary vehicle accessory can be operated, etc. The value of the displayed runtime may be adjusted, for example, by a user by: moving the position of the slider, by using an external control to select a value, etc.

When a user adjusts the condition setting control/display 805 (e.g., via the controls 801-804), a controller can automatically instruct the user interface 800 to adjust the runtime display/control 815 to display a predicted runtime of the primary vehicle accessory based on the user inputted desired condition setting. In some embodiments, the runtime display/control 815 is automatically adjusted based on environment data as well. For example, when a user adjusts the minimum temperature using controls 801 and 802 or adjusts the maximum temperature using the controls 803 and 804, the slider bar of the runtime display/control 815 is automatically adjusted to display the predicted runtime of the primary vehicle accessory to achieve the desired minimum and maximum temperatures. The user interface 800 can also interact with the controller to allow the controller to control the primary vehicle accessory to achieve the desired minimum and maximum temperatures inputted by the user.

Similarly, when a user adjusts the runtime control/display 815 (e.g., via the slider bar), the controller can automatically instruct the user interface 800 to adjust the condition setting display/control 805 to display an acceptable condition setting based on the user inputted desired runtime setting. In some embodiments, the condition setting display/control 805 is automatically adjusted based on environment data as well. For example, when a user adjusts the runtime control/display 815 (e.g., the slider bar), the displays 806 and 807 of the condition setting display/control 805 are automatically adjusted to display an acceptable minimum and maximum temperature of the primary vehicle accessory to achieve the desired runtime of the primary vehicle accessory. The user interface 800 can also interact with the controller to allow the controller to control the primary vehicle accessory at the acceptable minimum and maximum temperatures.

In some embodiments, the user interface 800 can also include a confirmation input (not shown) that is inputted by the user before the controller automatically instructs the user interface 800 to adjust the condition setting control/display 805 and/or the runtime control/display 815.

The operating mode selection 810 allows a user to select a particular mode of operation of the vehicle accessory. When the vehicle accessory is a HVACR unit, the operating mode selection 810 can allow a user to select from, for example, a fixed runtime target mode, a fixed temperature target mode, a companion mode, a delay mode, a no alarm mode, a remote operation mode, or other modes of operation for the user interface 800. In some embodiments, the operating mode selection 810 can allow a user to select operation modes of an APU (e.g., the APU 105 shown in FIGS. 1 and 2) and/or an HVACR unit (e.g., the HVACR unit 110 shown in FIGS. 1 and 2), etc.

In an embodiment, the companion mode may be a mode operating the HVACR unit when the driver may not be in the cabin but control of cabin climate is still required, for example, due to a pet in the cabin. The companion mode may be, for example, a mode where the condition setting may correspond to wider ranges of allowable temperatures, or a maximum allowable temperature for a condition setting may be higher than during other HVACR operations. The companion mode may additionally allow alerts and remote commands to be provided via, for example, a mobile device interfacing with a controller (e.g., the controller 115 shown in FIGS. 1 and 2) via a communications link (e.g., the communications link 125 shown in FIGS. 1 and 2).

In an embodiment, the fixed runtime mode allows the condition setting to be selectable within boundaries based on a target runtime.

In an embodiment, the fixed condition setting mode allows the target runtime to be set for a constant condition setting. The target runtime may be used to determine an operational profile for the HVACR unit to follow for the condition setting. In an embodiment, the selection of a target runtime for a fixed condition setting can be used to determine upper and lower bounds around the fixed condition setting.

In an embodiment, the delay mode can delay activation of the HVACR unit until a predetermined time. For example, the delay mode may include setting a time at which to achieve a certain temperature within the cabin.

In an embodiment, the no-alarm mode can disable one or more alerts so as not to disrupt the rest of someone in the cabin.

In an embodiment, the remote operation mode selection can allow the vehicle accessory to be activated in response to a signal (e.g., via the communications link 125 shown in FIGS. 1 and 2) from a server, a mobile device, etc.

In the embodiment shown in FIG. 8, the operating mode selection 810 is a button which may provide a drop-down menu listing the potential operating modes and allowing selection of an operating mode.

The orientation display 820 shows a preferred orientation of a vehicle to improve the runtime or condition setting at which the primary vehicle accessory (or any additional vehicle accessories) can be operated. While not shown in FIG. 8, the orientation display 820 may also show a current orientation of the vehicle. The orientation display 820 shown in FIG. 8 displays a compass with a rotation value in degrees that a vehicle should be rotated. In other embodiments, the orientation display 820 can show, for example, instructions to turn the vehicle to the left or the right, etc. In the embodiment shown in FIG. 8, the orientation display 820 also shows a line to align with a vertical position.

The additional vehicle accessories display/control 825 includes a list 822 displaying one or more additional vehicle accessories which may be operated using the finite power storage unit. Additional vehicle accessories may include, for example, sunshade(s) for a window/windshield of the vehicle, a refrigerator, a television, a video game console, a microwave, one or more device charging station(s), a continuous positive airway pressure (CPAP) machine, a coffee maker, etc.

Corresponding to each additional vehicle accessory is an input field 830 indicating whether the additional vehicle accessory is being used. The input field 830 is shown as a checkbox, but it will be appreciated that in other embodiments the input field 830 may be shown in other ways such as a radio button for example. In some embodiments, the input field 830 can also allow a user to input a desired amount of time that the user would like the additional vehicle accessory to be in use.

Also, corresponding to each additional vehicle accessory is an output field 835. The output field 835 can display the impact of the additional vehicle accessory on the runtime of the primary vehicle accessory. In an embodiment, the output field 835 may show whether the associated additional vehicle accessory may be used without affecting the displayed primary vehicle accessory condition setting and runtime. In an embodiment, the output field 835 may indicate an amount of time that may be added to the primary vehicle system runtime by deactivating the particular additional vehicle accessory. In an embodiment, the output field 835 may indicate an amount of time that the primary vehicle accessory runtime may be reduced if the additional vehicle accessory is in use. In an embodiment, the time added or subtracted from the primary runtime that is shown in output field 835 is determined based on an input in the input field 830. The output field 835 may also highlight additional loads having an impact on the primary vehicle accessory condition setting or the runtime.

In operation, the condition setting display/control 805 can be automatically updated based on user input at the input field 830 indicating whether any of the additional vehicle accessories are desired to be in operation and based on user adjustment of the runtime display/control 815. Also, the runtime display/control 815 can be automatically updated based on user input at the input field 830 indicating whether any of the additional vehicle accessories are desired to be in operation and based on user adjustment of the condition setting display/control 805. It will be appreciated that in some embodiments, the runtime display/control 815 and/or the condition setting display/control 805 can be automatically adjusted based on environment data as well.

Aspects:

It is appreciated that any of aspects 1-11, 12-17, and 18-20 can be combined.

Aspect 1. A method for efficient power management of a finite power storage unit that provides a finite amount of power to a vehicle accessory, the method comprising:

receiving an input parameter, wherein the input parameter includes one of a desired runtime for the vehicle accessory and a desired condition setting for the vehicle accessory;

receiving an environment data;

a processor determining an output parameter based on the input parameter and the environment data, wherein the output parameter includes one of an acceptable condition setting for the vehicle accessory and a predicted runtime for the vehicle accessory;

providing the output parameter to a display for displaying the output parameter; and the processor controlling operation of the vehicle accessory based on the output parameter.

Aspect 2. The method of aspect 1, wherein when the input parameter is the desired condition setting for the vehicle accessory, the output parameter is the predicted runtime for the vehicle accessory to achieve the desired condition setting, and wherein when the input parameter is the desired runtime of the vehicle accessory, the output parameter is the acceptable condition setting for the vehicle accessory to achieve the desired runtime.

Aspect 3. The method of any of aspects 1 and 2, wherein the vehicle accessory includes a heating, ventilation, air conditioning or refrigeration (HVACR) system and the finite power storage unit is an auxiliary power unit (APU).

Aspect 4. The method of any of aspects 1 and 2, wherein the vehicle accessory includes a transport refrigeration unit.

Aspect 5. The method of any of aspects 1-4, wherein receiving the environment data includes receiving weather data from a server.

Aspect 6. The method of aspect 5, wherein the weather data includes a solar load forecast.

Aspect 7. The method of any of aspects 1-6, wherein the finite power storage unit includes one or more batteries, and wherein the environment data includes a state of charge of each of the one or more batteries.

Aspect 8. The method of aspect 7, wherein determining the state of charge of each of the one or more batteries includes:

connecting one of the one or more batteries to a load;

measuring a current draw and a voltage drop across the one of the one or more batteries; and determining the state of charge of the one of the one or more batteries based on the current draw and the voltage drop across the one of the one or more batteries.

Aspect 9. The method of aspect 7, wherein determining the state of charge of the one or more batteries includes:

measuring a voltage of each of the one or more batteries;

engaging at least one of the one or more batteries with a load;

measuring a current draw and a voltage drop across the at least one of the one or more batteries;

disengaging the at least one of the one or more batteries from the load;

measuring a open circuit voltage of the at least one of the one or more batteries; and determining the state of charge of the at least one of the one or more batteries based on the open circuit voltage of the at least one of the one or more batteries.

Aspect 10. The method of any of aspects 1-9, further comprising:

storing the output parameter in a memory;

updating the environment data;

determining an updated output parameter using the updated environment data;

determining a deviation of the updated output parameter from a stored value of the output parameter that is stored in the memory; and providing an alert regarding a change to the output parameter.

Aspect 11. The method of any of aspects 1-10, wherein determining the output parameter includes:

entering the environment data into a model correlating vehicle accessory condition setting and runtime;

entering the input parameter into the model correlating vehicle accessory condition setting and runtime; and determining the output parameter based on the model correlating vehicle accessory condition setting and runtime.

Aspect 12. A finite power storage unit and vehicle accessory system, comprising:

a vehicle accessory;

a finite power storage unit that provides a finite amount of power to the vehicle accessory;

an input device that receives an input parameter, wherein the input parameter includes one of a desired runtime for the vehicle accessory and a desired condition setting for the vehicle accessory; and a processor that:

receives an environment data, determines an output parameter based on the input parameter and the environment data, and controls operation of the vehicle accessory based on the output parameter, wherein the output parameter includes one of an acceptable condition setting for the vehicle accessory and a predicted runtime for the vehicle accessor, and wherein the processor provides the output parameter to a display for displaying the output parameter.

Aspect 13. The vehicle accessory and power source system of aspect 12, further comprising a communications link for receiving environment data.

Aspect 14. The vehicle accessory and power source system of any of aspects 12 and 13, wherein the vehicle accessory includes a heating, ventilation, air conditioning or refrigeration (HVACR) system and the finite power storage unit is an auxiliary power unit.

Aspect 15. The vehicle accessory and power source system of any of aspects 12 and 13, wherein the vehicle accessory includes a transport refrigeration unit.

Aspect 16. The vehicle accessory and power source system of any of aspects 12-15, wherein when the input parameter is the desired condition setting for the vehicle accessory, the output parameter determined by the processor is the predicted runtime for the vehicle accessory to achieve the desired condition setting, and wherein when the input parameter is the desired runtime for the vehicle accessory, the output parameter determined by the processor is the acceptable condition setting for the vehicle accessory to achieve the desired runtime.

Aspect 17. The vehicle accessory and power system of any of aspects 12-16, further comprising:

a memory storing a model associating a vehicle accessory condition setting with a system runtime based on the input parameter and the environment data, wherein the processor determines the output parameter based on the input parameter, the environment data and the model.

Aspect 18. A user interface for a vehicle accessory powered by a finite power storage unit, comprising:
- a condition setting display showing a condition setting of the vehicle accessory;
- a condition setting control allowing a user to input a desired condition setting of the vehicle accessory;
- a runtime display showing a runtime of the vehicle accessory when powered by the finite power storage unit; and
- a runtime control allowing the user to input a desired runtime for the vehicle accessory,
- wherein, when the user inputs the desired condition setting of the vehicle accessory on the condition setting control, the runtime display is automatically updated based on the desired condition setting to display a predicted runtime of the vehicle accessory to achieve the desired condition setting of the vehicle accessory, and
- wherein, when the user inputs the desired runtime of the vehicle accessory on the runtime control, the condition setting display is automatically updated based on the desired runtime to display an acceptable condition setting of the vehicle accessory to achieve the desired runtime of the vehicle accessory.

Aspect 19. The user interface of aspect 18, further comprising an operating mode selection allowing selection of an operating mode for the vehicle accessory.

Aspect 20. The user interface of any of aspects 18 and 19, further comprising:
- an additional vehicle accessories display that displays a list of one or more additional vehicle accessories on the finite power storage unit; and
- an additional vehicle accessories control allowing the user to input one or more desired additional vehicle accessories for operation,
- wherein, when the user inputs one or more desired additional vehicle accessory accessories for operation, at least one of:
  - the condition setting display is automatically updated based on the inputted one or more desired additional vehicle accessories for operation and the desired runtime to display an acceptable condition setting of the vehicle accessory, and
  - the runtime display is automatically updated based on the inputted one or more desired additional vehicle accessories for operation and the desired condition setting to display the predicted runtime of the vehicle accessory.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A finite power storage unit and vehicle accessory control system, comprising:
   a processor configured to:
   receive an input parameter, wherein the input parameter includes one of a desired runtime for a vehicle accessory and a desired condition setting for the vehicle accessory,
   receive environment data,
   determine an output parameter based on the input parameter and the environment data, and
   provide the output parameter to a display, the display configured to display the output parameter,
   wherein the output parameter includes one of an acceptable condition setting for the vehicle accessory to achieve the desired runtime and a predicted runtime for the vehicle accessory at the desired condition setting when powered by a finite power storage unit that provides a finite amount of power to the vehicle accessory.

2. The finite power storage unit and vehicle accessory system of claim 1, wherein the finite power storage unit is an auxiliary power unit (APU).

3. The finite power storage unit and vehicle accessory system of claim 2, wherein the APU includes a prime mover and a fuel tank.

4. The finite power storage unit and vehicle accessory system of claim 2, wherein the APU includes one or more batteries.

5. The finite power storage unit and vehicle accessory system of claim 4, wherein the APU includes a battery management system.

6. The finite power storage unit and vehicle accessory system of claim 1, wherein the input device is a mobile device.

7. The finite power storage unit and vehicle accessory system of claim 1, wherein the display is a display of a mobile device.

8. A vehicle comprising the finite power storage unit and vehicle accessory system of claim 1.

9. The vehicle of claim 8, further comprising a primary power source, wherein the finite power storage unit is configured to provide power to the vehicle accessory when the primary power source is unavailable.

10. The vehicle of claim 9, wherein the vehicle accessory is a cabin accessory of the semi-tractor or a hotel load of the semi-tractor.

11. The vehicle of claim 9, wherein the vehicle accessory is a cabin heating, ventilation, refrigeration, and air conditioning (HVACR) system.

12. The vehicle of claim 9, wherein the finite power storage unit includes one or more batteries, and the primary power source is configured to provide power to charge the one or more batteries.

13. The vehicle of claim 8, wherein the vehicle is a semi-tractor.

14. The finite power storage unit and vehicle accessory control system of claim 1, wherein a stored energy of the finite power storage unit is variable.

15. The finite power storage unit and vehicle accessory control system of claim 1, wherein the processor is further configured to receive a stored energy of the finite power storage unit, and the output is further based on the received stored energy.

16. A method for efficient power management of an auxiliary power unit (APU), wherein the APU provides a finite amount of power to a vehicle accessory, the method comprising:
   receiving an input parameter, wherein the input parameter includes one of a desired runtime for the vehicle accessory and a desired condition setting for the vehicle accessory; receiving an environment data;
   a processor determining an output parameter based on the input parameter and the environment data, wherein the output parameter includes one of an acceptable condition setting for the vehicle accessory to achieve the desired runtime and a predicted runtime for the vehicle accessory at the desired condition setting when powered by the APU;

providing the output parameter to a display for displaying the output parameter; and the processor controlling operation of the vehicle accessory based on the output parameter.

17. A method for efficient power management of a finite power storage unit that provides a finite amount of power to a cabin heating, ventilation, air conditioning and refrigeration (HVACR) system of a semi-tractor, the method comprising:

receiving an input parameter, wherein the input parameter includes one of a desired runtime for the cabin HVACR system and a desired condition setting for the cabin HVACR system; receiving an environment data;

a processor determining an output parameter based on the input parameter and the environment data, wherein the output parameter includes one of an acceptable condition setting for the cabin HVACR system to achieve the desired runtime and a predicted runtime for the cabin HVACR system at the desired condition setting when powered by the finite power storage unit;

providing the output parameter to a display for displaying the output parameter; and the processor controlling operation of the cabin HVACR system based on the output parameter.

* * * * *